(12) United States Patent
Abdelhalim et al.

(10) Patent No.: US 10,574,023 B2
(45) Date of Patent: Feb. 25, 2020

(54) CMOS EXTERNALLY MODULATED LASER DRIVER

(71) Applicant: INPHI CORPORATION, Santa Clara, CA (US)

(72) Inventors: Karim Abdelhalim, Newport Coast, CA (US); Jorge Pernillo, Daly City, CA (US); Halil Cirit, Burlingame, CA (US); Michael Le, Laguna Niguel, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 16/109,605

(22) Filed: Aug. 22, 2018

(65) Prior Publication Data

US 2018/0366898 A1     Dec. 20, 2018

(51) Int. Cl.
| | |
|---|---|
| *H01S 3/09* | (2006.01) |
| *H01S 3/0933* | (2006.01) |
| *H01S 3/091* | (2006.01) |
| *H03M 1/10* | (2006.01) |
| *H03M 1/08* | (2006.01) |
| *H01S 5/042* | (2006.01) |
| *H03M 1/68* | (2006.01) |

(52) U.S. Cl.
CPC .............. *H01S 3/09* (2013.01); *H01S 3/0912* (2013.01); *H01S 3/0933* (2013.01); *H03M 1/089* (2013.01); *H03M 1/1047* (2013.01); *H01S 5/042* (2013.01); *H01S 5/0427* (2013.01); *H03M 1/687* (2013.01)

(58) Field of Classification Search
CPC ........ H01S 3/09; H01S 3/0912; H01S 3/0933; H01S 5/042; H03M 1/687; H03M 1/089; H03M 1/1047
See application file for complete search history.

(56) References Cited

U.S. PATENT DOCUMENTS 8,896,352 B2 * 11/2014 Huang .................. H03H 11/44
327/108

* cited by examiner

*Primary Examiner* — Armando Rodriguez
(74) *Attorney, Agent, or Firm* — Richard T. Ogawa; Ogawa P.C.

(57) ABSTRACT

The present invention relates to telecommunication techniques and integrated circuit (IC) devices. In a specific embodiment, the present invention provides a laser deriver apparatus that includes a main DAC section and a mini DAC section. The main DAC section processes input signal received from a pre-driver array and generates an intermediate output signal. The mini DAC section provides a compensation signal to reduce distortion of the intermediate output signal. The intermediate output signal is coupled to output terminals through a cascode section and/or a T-coil section. There are other embodiments as well.

19 Claims, 9 Drawing Sheets

CMOS EXTERNALLY MODULATED LASER DRIVER

CROSS-REFERENCES TO RELATED APPLICATIONS

This application claims the priority of U.S. patent application Ser. No. 15/605,829 filed May 25, 2017 which is incorporated by reference herein for all purposes.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to telecommunication techniques and integrated circuit (IC) devices. More specifically, various embodiments of the present invention provide an optical communication system.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes more than 500 TB of data daily. With such high demands on data storage and data transfer, existing data communication systems need to be improved to address these needs.

With advent of semiconductor technology, CMOS devices and processes are used to design communication systems implementing optical fiber links. As CMOS technology is scaled down to make circuits and systems run at higher speed and occupy smaller chip (die) area, the operating supply voltage is reduced for lower power consumption, thereby allowing communication device to efficiently carry high data speed. For example, it is advantageous to integrate externally modulated laser driver into CMOS dies.

There have been many types of communication systems and methods. Unfortunately, they have been inadequate. Therefore, improved communication systems and methods are desired.

BRIEF SUMMARY OF THE INVENTION

The present invention relates to telecommunication techniques and integrated circuit (IC) devices. In a specific embodiment, the present invention provides a laser deriver apparatus that includes a main DAC section and a mini DAC section. The main DAC section processes input signal received from a pre-driver array and generates an intermediate output signal. The mini DAC section provides a compensation signal to reduce distortion of the intermediate output signal. The intermediate output signal is coupled to output terminals through a cascode section and/or a T-coil section. There are other embodiments as well.

According to an embodiment, the present invention provides a laser driver system that includes one or more current sources. The system also includes a first DAC section that is configured to convert n bits input signals to a first intermediate signal. The first DAC section has one or more thermal bits. The first DAC section is coupled to the one or more current sources. The system also includes a distortion compensation section that is configured to generate a compensation signal based at least on the one or more thermal bits. The system additionally includes a cascode section that has one or more cascode amplifiers. The cascode section is configured to generate a second intermediate signal based on the first intermediate signal and the compensation signal. The system further includes a voltage supply. The system also includes a plurality of T-coil elements. The supply voltage is coupled to the cascode section via the plurality of T-coil elements. The supply voltage can be coupled to T-coil elements via on-chip termination. For example, impedance matching is provided between the T-coil elements and the voltage supply. For example, impedance matching can be configured on or off chip. The system also includes a pair of differential output terminals coupled to the cascode section. The differential output terminals are configured to provide output signals based at least on the second intermediate signal.

According to another embodiment, the present invention provides an external modulated laser driver apparatus. The apparatus includes one or more current sources. The apparatus also includes a main DAC section that is configured to convert n bits input signals to a first intermediate signal. The first DAC section has one or more thermal bits. The first DAC section is coupled to the one or more current sources. The apparatus further includes a mini DAC section that is configured to generate a compensation signal based at least on the one or more thermal bits. The apparatus also includes a cascode section comprising one or more cascode amplifiers. The cascode section is configured to generate a second intermediate signal based on the first intermediate signal and the compensation signal. The apparatus also includes a pair of differential output terminals coupled to the cascode section. The differential output terminals are configured to provide output signals based at least on the second intermediate signal.

According to yet another embodiment, the present invention provides an external modulated laser driver apparatus that includes one or more current sources. The apparatus also includes a pre-driver array to provide n bits input signals. The apparatus additionally includes a main DAC section that is configured to convert the n bits input signals to a first intermediate signal. The first DAC section has one or more thermal bits. The first DAC section is coupled to the one or more current sources. The apparatus includes a mini DAC section that includes m bits. The mini DAC is configured to generate a compensation signal based at least on the one or more thermal bits. The apparatus further includes a cascode section comprising one or more cascode amplifiers. The cascode section is configured to generate a second intermediate signal based on the first intermediate signal and the compensation signal. The apparatus has a pair of differential output terminals coupled to the cascode section. The differential output terminals is configured to provide output signals based at least on the second intermediate signal.

It is to be appreciated that embodiments of the present invention provide many advantages over conventional techniques. Among other things, the use of T-coils and/or cascode amplifiers allow for large voltage swing provided by the power supply. For example, a supply voltage can provide up to 1.98V to support 1V single-ended or 2V differential voltage. In various implementations, a supply voltage as low as 1.95V can provide over 1V single-ended or over 2V differential voltage. It is to be appreciated that external components such as bias T is not required. The T-coils boost system bandwidth and provide improved return loss to pass a stringent return loss mask. A mini DAC section functions as a non-binary DAC that removes distortion and improves SNDR and RLM. Additionally, by incorporating components of a EML drivers on a CMOS die, where DSP and/or digital components are configured on the same CMOS die. The integration provides for reduction in cost, size, and power consumption. In comparison, for similar performance, conventional EML apparatus would require external (e.g., SiGe based) driver. Furthermore, laser drivers according to embodiments of the present invention can operate at high-speed (e.g., 28 Gbps and higher).

Embodiments of the present invention can be implemented in conjunction with existing systems and processes. Laser drivers according to embodiments of the present invention may be manufactured using existing techniques and devices. For example, mainstream techniques such as 16 nm/14 nm CMOS processes can be used in manufacturing of laser driver, which also making integration possible. For example, laser drivers according to embodiments of the present invention can be integrated with digital signal processors. Embodiments of laser drivers and operating techniques thereof can be compatible with existing systems. For example, optical communication systems can readily incorporate laser drivers of the present invention. There are other benefits as well.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1A:
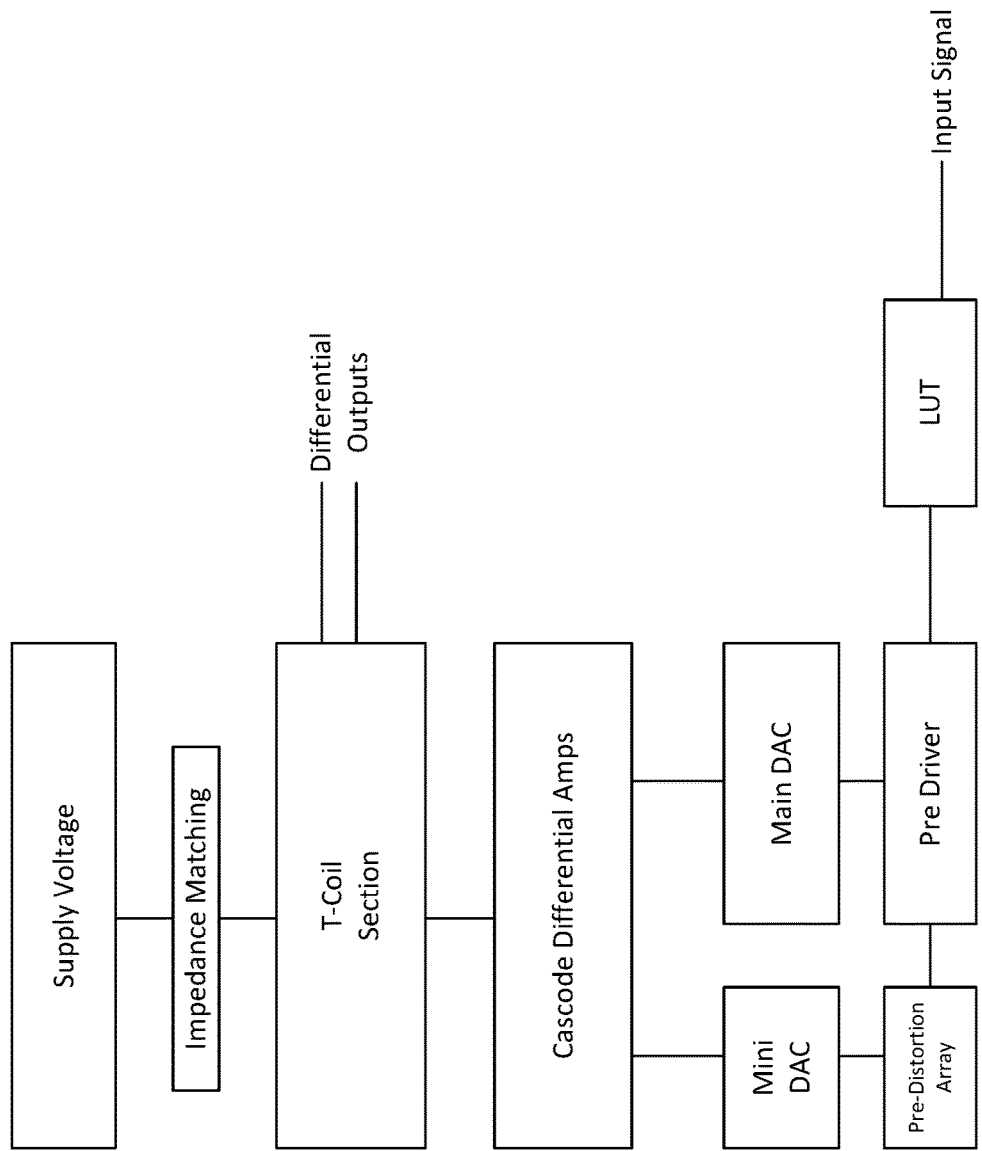
FIG. 1A is a simplified block diagram illustrating a laser driver architecture according to embodiments of the present invention.

The present invention relates to telecommunication techniques and integrated circuit (IC) devices. In a specific embodiment, the present invention provides a laser deriver apparatus that includes a main DAC section and a mini DAC section. The main DAC section processes input signal received from a pre-driver array and generates an intermediate output signal. The mini DAC section provides a compensation signal to reduce distortion of the intermediate output signal. The intermediate output signal is coupled to output terminals through a cascode section and/or a T-coil section. There are other embodiments as well.

As explained above, externally modulated laser (EML) drivers are widely used in data communication applications. For example, EML drivers need to operate at high speed (e.g., 28 Gbps and up) with low power consumption level and small form factor.

Embodiments of the present invention are directed to communication devices. More specifically, CMOS based externally modulated laser (EML) drivers are provided, where laser can be driven directly with pulse-amplitude modulation (PAM). For example, formats such as PAM4, PAM8, and others can be supported. It is to be appreciated that by configuring EML drivers on CMOS dies, it is possible for EML drivers to integrate with digital signal processors, thereby allowing the removal of external driver (e.g., SiGe based driver), which translates to significant power savings and size reductions. As example, laser derivers according to the present invention can be manufactured using existing mainstream CMOS processes (e.g., 16 nm/14 nm processes).

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

It is to be appreciated that high-speed (e.g., 28 Gbps and higher) communication can be achieved according to embodiments of the present invention. FIG. 1A is a simplified block diagram illustrating a laser driver architecture according to embodiments of the present invention. This diagram is merely an example, which should not unduly limit the scope of the claims. One of ordinary skill in the art would recognize many variations, alternatives, and modifications. As shown in FIG. 1A, differential input signals are first mapped using a lookup table (LUT). The LUT output is provided to a pre-driver module as show (e.g., illustrated in FIG. 4). For example, LUT output differential bits to the pre-driver module, and the mini DAC and the main DAC receive and process differential input signals. The pre-driver module provides input buffers and delays to match timing. A pre-distortion module receives input from the pre-driver module and is coupled to the mini digital-to-analog converter (DAC), which facilitates pre-distortion compensation based on the quality of communication lanes. For example, pre-distortion module includes logic circuits and buffer that, working in conjunction with the mini DAC, linearize the output transfer curve. For example, the mini DAC uses three least significant bits (LSB) to provide non-binary distortion compensation, which improves signal to noise distortion ratio (SNDR) and/or ratio level mismatch (RLM) performance. The main DAC receives differential pairs of input for each of its input bits through the pre-driver module. In various embodiment, the mini DAC generates a compensation signal based on control signals generate by the thermometer bits of the main DAC, as explained below. The compensation signal is then processed by cascode differential amplifiers. For example, the compensation signal is added to or removed from the output signal generated by the main DAC. In various embodiments, the pre-distortion module comprises a pre-driver array, which can minimize power dissipation and match timing of input signals.

As shown, the cascode different amplifiers (e.g., implemented as a cascode section) are coupled to both DAC and a supply voltage. For example, the supply voltage provides up to 1.98V to support 1V single ended (and 2V differential). In various implementations, a supply voltage as low as 1.95V can provide over 1V single-ended or over 2V differential voltage. The cascode differential amplifiers in turn allows for high speed communication, offers signal protection, and improves device reliability. The cascode section comprising cascode amplifier provide a meaningful isolation between the supply voltage and the DACs. The T-coils configured between the supply voltage and the cascode differential amplifiers provides stringent return loss mask and boosts bandwidth. As mentioned above, impedance matching is provided between the T-coil elements and the supply voltage. The main DAC is connected to the cascode differential amplifiers that reduces distortion and improves signal quality. It is to be appreciated that the architecture illustrated in FIG. 1A provides for more than 1 Vpp single-ended (2 Vpp differential) from a mainstream 16 nm/14 nm CMOS technology. In contrast, conventional systems need to be implemented with SiGe heterojunction bipolar transistor (HBT) or InP HBT technology to achieve similar performance level.

It is to be appreciated that the laser driver architecture illustrated in FIG. 1A can be incorporated into various types of communication systems. For example, a digital input signal carrying data is converted by the laser driver to analog signal that is used to modulate and drive a laser source to generate modulated optical signals. In various embodiments of the present invention, data communication uses PAM.

Figure 1B:
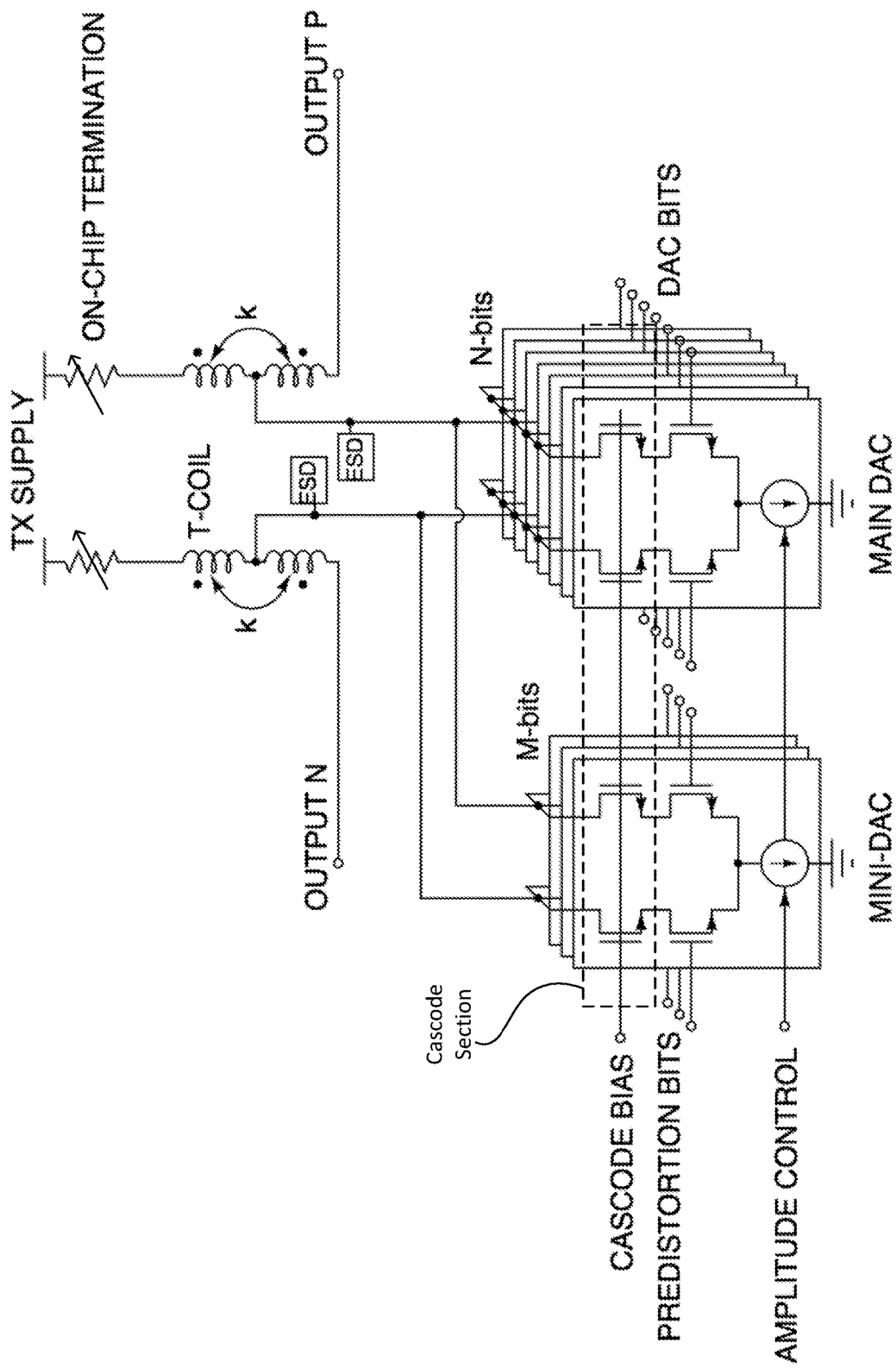
FIG. 1B is a simplified diagram illustrating an EML driver system according to an embodiment of the present invention.
Figure 4:
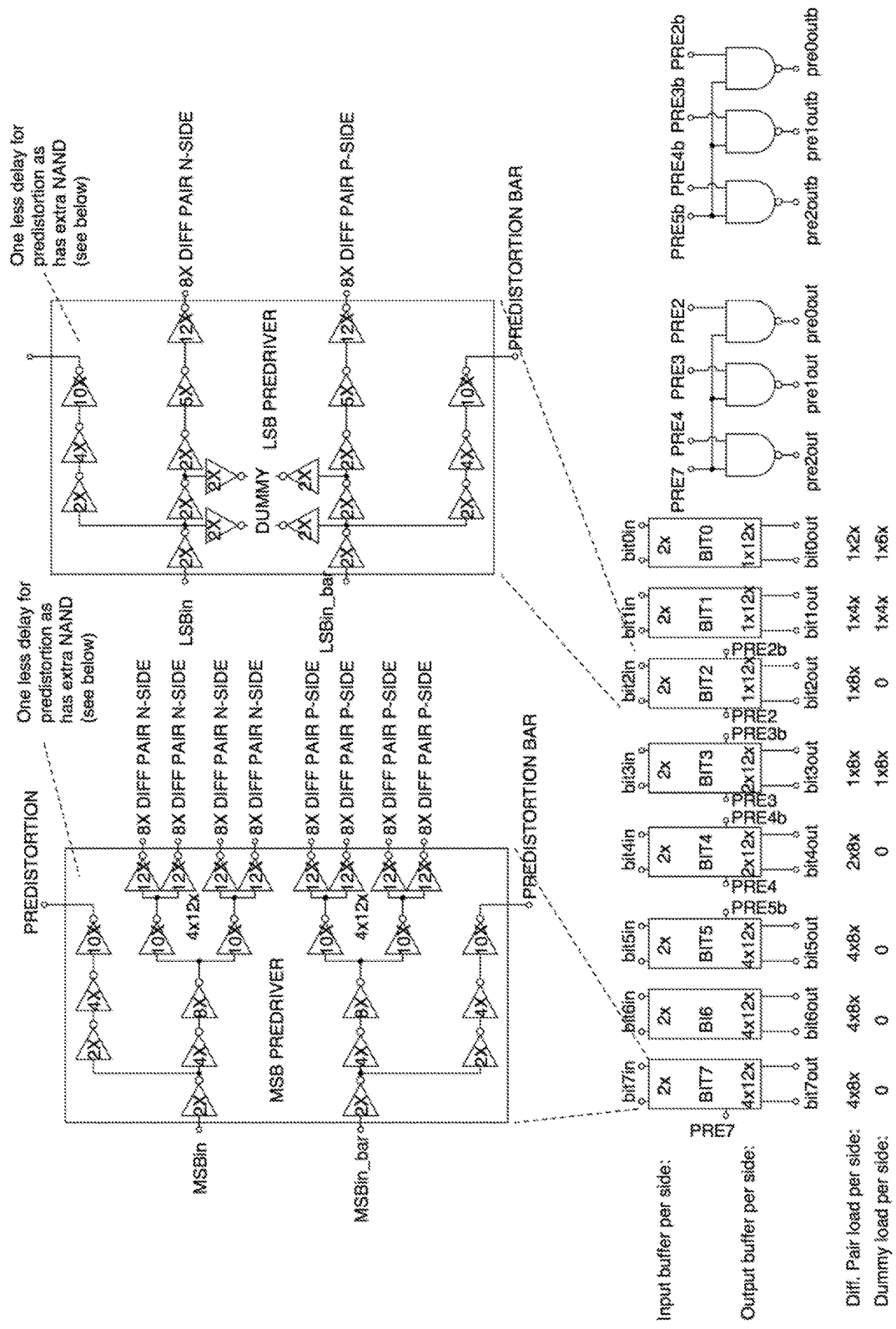
FIG. 4 is a simplified block diagram illustrating pre-drivers according to embodiments of the present invention.

FIG. 1B is a simplified diagram illustrating an EML driver system according to an embodiment of the present invention. This diagram is merely an example, which should not unduly limit the scope of the claims. One of ordinary skill in the art would recognize many variations, alternatives, and modifications. As shown in FIG. 1B, input signals are processed by both the mini-DAC section and the main DAC section. Input signals are received as a differential pair that includes both N input and P input. In various embodiments, input signals are provided by a pre-driver array, which is illustrated in FIG. 4 and described below. Among other features, the pre-driver array functions as an input buffer and matches timing with a plurality of gate delays. For example, pre-distortion bits are generated through the pre-driver array to minimize power dissipation. The pre-driver array is described in further details below and illustrated in FIG. 4.

Pre-distortion bits are processed by the mini-DAC section. For example, the mini-DAC section processes M bits for pre-distortion. In certain embodiments, the mini DAC section processes three pre-distortion bits. As shown, the mini-DAC section includes three slices for processing three LSB bits of the input data. As explained above, the mini-DAC is implemented as a non-binary DAC that can improve SNDR and RLM of signal. Among other features, the mini DAC specifically targets the LSBs for pre-distortion. Distortion compensation is performed as a part of the DAC function. The distortion compensation signal is used to compensate the output of the main DAC, and the output the mini DAC and the main DAC are coupled through the cascode section. It is to be appreciated that the mini DAC can be implemented with minimal physical dimension that translates to minimal loading on driver.

The main DAC section is configured to process DAC bits. Depending on the implementation, the main DAC section may include N slices corresponding to N bits. For example, the main DAC shown in FIG. 1B includes 7 slices for 7 bits. For example, based on the 7 bits of input signals, analog output signals are generated. As mentioned above, input signal of the main DAC may be provided by a pre-driver array. The output of the main DAC, is an analog signal, is coupled to a cascode section. Depending on the bit position, one or more cascode amplifiers may be used. For example, one or more LSB bits of the main DAC may share lumped cascode amplifiers, which each of the MSB bits is implemented with their own cascode amplifier(s).

Amplitude control is provided by current source(s) as shown. For example, the amplitude control is coupled to both the mini DAC section and the main DAC section. In various embodiments, the main DAC and the mini DAC uses current sources amplitude control that provide different current levels based on the bit position. For example, "bit 0" of the main DAC uses less current than "bit 1". In addition to amplitude control, cascode bias is also provided.

As shown, input differential pairs for both main DAC and mini DAC are coupled to the cascode section, which allows for signal isolation and large voltage swing. The cascode section includes a number of cascode amplifiers. For example, the cascode section receives a cascode bias signal from a control module. For example, the cascode section is implemented using MOSFETs that need to be properly biased (e.g., enough source voltage) for operation. Depending on the implementation, other types of transistors (e.g., BJT) may be used to implement cascode amplifiers.

The output signals (OUTPUT N and OUTPUT P as shown) attribute to both the main DAC output and the mini DAC output. In various embodiments, the mini DAC output is a compensation signal that improves quality of main DAC output. For example, analog output signals from main DAC ad the mini DAC are coupled to output terminals OUTPUT N and OUPUT P via T-coils and the cascode section as shown. It is to be appreciated that the T-coils, as shown in FIG. 1B, can boost output bandwidth while simultaneously passing a stringent return loss mask. The TX supply, or output power supply, as illustrated in FIG. 1B is coupled to the T-coils. In various embodiments, power supply is coupled to T-coils via on-chip termination. For example, on-chip termination is implemented using on-chip tunable resistor that is matches the system impedance (e.g., 50 ohms single-ended or 100 ohms differential). More specifically, the tunable resistors configured between the TX supply and the T-coils are shown as tunable resistors. T-coils are not directly coupled to the power supply, but connected to power supply via the on-chip termination. For example, TX supply can provide up to 1.98V for 1V singled-ended or 2V differential supply voltage. It is to be appreciated that the relatively high voltage of 1.98V is possible at least due to the cascode section, which improves system reliability and provides a buffer between the DAC circuits and the TX supply.

Figure 2:
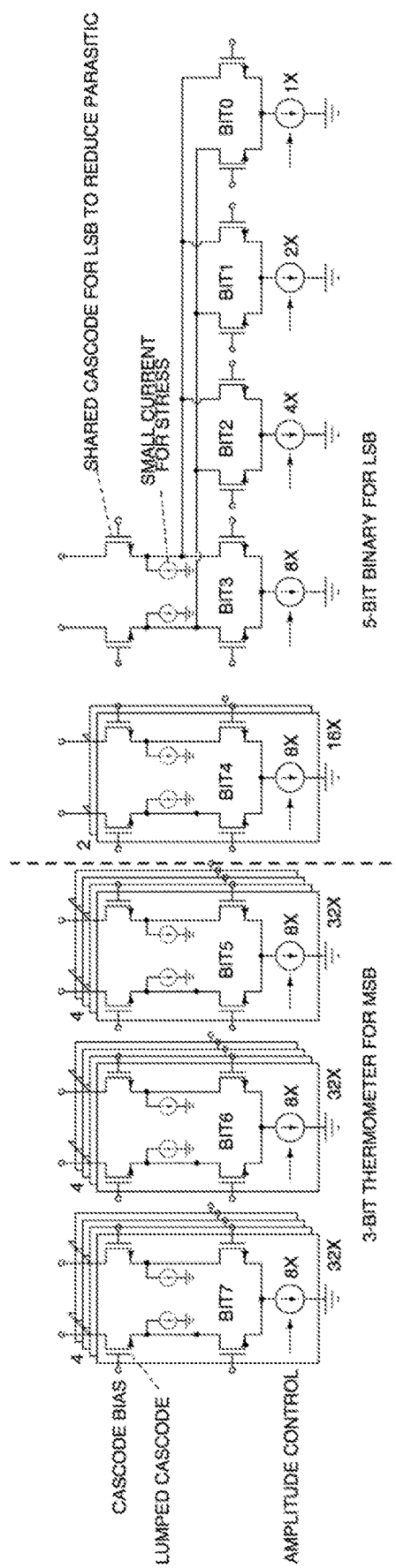
FIG. 2 is a simplified diagram illustrating a main DAC according to embodiments of the present invention.

FIG. 2 is a simplified diagram illustrating a main DAC according to embodiments of the present invention. This diagram is merely an example, which should not unduly limit the scope of the claims. One of ordinary skill in the art would recognize many variations, alternatives, and modifications. As shown in FIG. 2, the main DAC includes 8 bits. The LSB section (BIT0-4) provides five bits for LSBs. Each bit at the LSB section receives signals as differential input pair. The LSB section shares a cascode amplifier (i.e., a lumped cascode amplifier) that reduces undesirable parasitic capacitance. As parts of the cascode amplifier, small current sources are provided to compensate for stress. The source terminals of the LSB transistors are coupled to a current source with amplitude control. The amplitude of the bias current depends on the bit position. For example, bias current of BIT1 is 2X of BIT0 bias current, and bias current of BIT2 is 4X of BIT0 bias current (or 2X of BIT1 bias current). For BIT4, 16X slices are used to obtain the desired output. DAC slices are described in further details below.

The MSBs of the main DAC are configured in slices. For example, 32X slices are respectively used to implement BIT5, BIT6, and BIT7. A 3-bit thermometer is provided for the MSBs. As explained above, cascode amplifiers in a lumped configuration are coupled to the DACs, and cascode bias is coupled to the transistor gates of cascode amplifiers. The lumped cascode amplifier configuration on the LSBs of the DAC can reduce undesirable parasitic capacitance. For example, the MSB bits of the main DAC use in-slice cascode to provide optimal SNDR and matching. The LSB bits share a lumped cascode to reduce parasitic capacitance. In various embodiments, a relative interface is used, which is based on 2:1 MUX and pre-drivers to the main DAC. An exemplary pre-driver is illustrated in FIG. 4 and described below. The lumped cascode configuration can also reduce return loss and increase bandwidth. As an example, BIT4 to BIT7 use a per-slice cascode for best SNDR. BIT0 to BIT3 use lumped cascode amplifier configuration to reduce parasitic capacitance and improve system bandwidth. In various embodiments, bias current for the MSB DACs is provided by the current sources with amplitude control functionality as shown, with an amplitude of 8X.

For the DAC segments (e.g., main DAC section and mini DAC section) to properly function, they need to match the timing In various embodiments, the final stage pre-drivers (e.g., configured at 12X size) drive a 1 X 8 DAC equivalent differential pair to matching timing, to minimize excessive power dissipation, and to improve SNDR. For example, the thermometer-based bits (BIT5, BIT6, and BIT7 at the main DAC section) are each broken up into four equal slices, and each of the slices is driven by four 12X inverters. BIT4 of the main DAC is broken up to into 2 equal slices, each driven by two 12X inverters. BIT3 is broken up into an actual slice and a dummy slice, each driven by two 12X inverters. BIT2 comprises single slice, driven by a single 12X inverter. BIT1 comprises half slice and a half dummy slice driven by 12X inverter. BIT0 comprises a quarter slice and a ¾ dummy slice driven by a 12X inverter. It is to be appreciated the main DAC can be implemented in other ways as well.

Figure 3A:
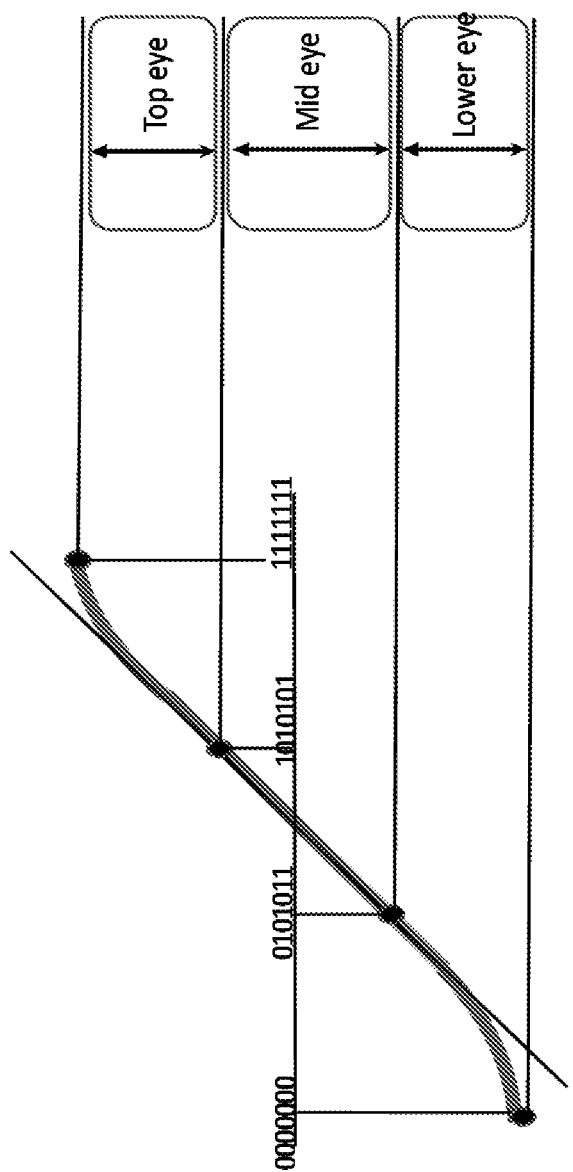
FIG. 3A is a graph illustrating DAC output vs. DAC input relative to eye levels.

As mentioned above, DACs can be susceptible to distortion and non-linearity. FIG. 3A is a graph illustrating DAC output vs. DAC input relative to eye levels. In FIG. 3A, four DAC output levels are separated by a top eye, a mid eye, and a lower eye. Ideally, the "eyes" should be symmetrical, and the DAC output curve should be substantially linear. Unfortunately, nonlinearity of DAC often leads to asymmetrical eyes and failing RLM specifications. As shown in FIG. 3A, the top eye, the mid eye, and the lower eye have different eye height, and DAC curve is not linear. As can be seen in FIG. 3A, the DAC curve at the mid eye region is substantially linear, and nonlinearity is more pronounced at the outer regions of top eye and bottom eye. In various embodiments, compensation techniques are limited to these outer regions and turned off at the mid eye region to avoid unnecessary processing.

Figure 3B:
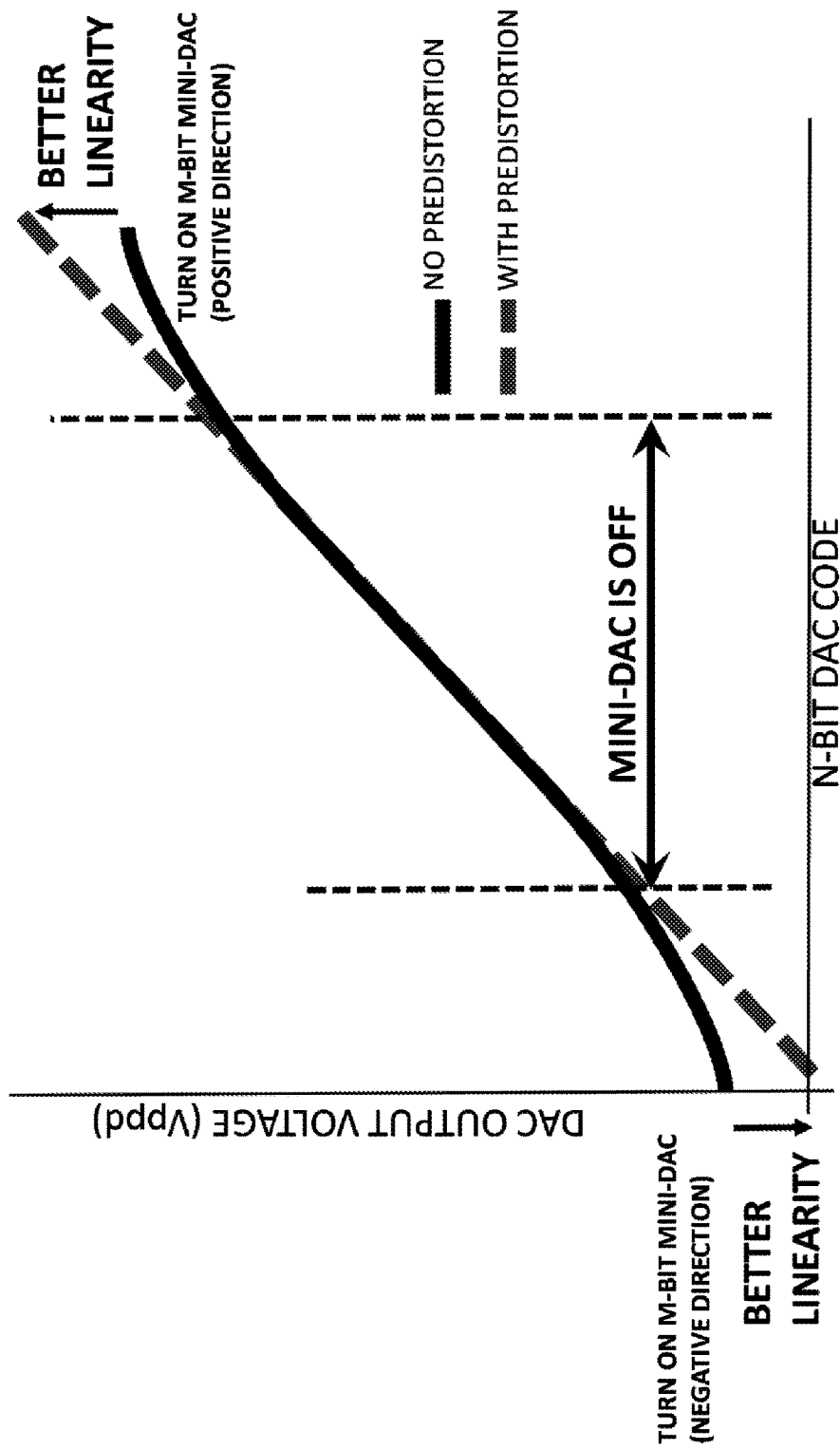
FIG. 3B illustrates distortion compensation that removes systematic compression according to embodiments of the present invention.

FIG. 3B illustrates distortion compensation that removes systematic compression according to embodiments of the present invention. This diagram is merely an example, which should not unduly limit the scope of the claims. One of ordinary skill in the art would recognize many variations, alternatives, and modifications. In Region A, the system enables a 3-bit non-binary mini-DAC to add positive current to linearize the main DAC. In Region B, the system enable the 3-bit non-binary mini-DAC to add negative current to linearize the main DAC. As explained above, pre-distortion compensation may be turned off at the linear region.

Figure 3C:
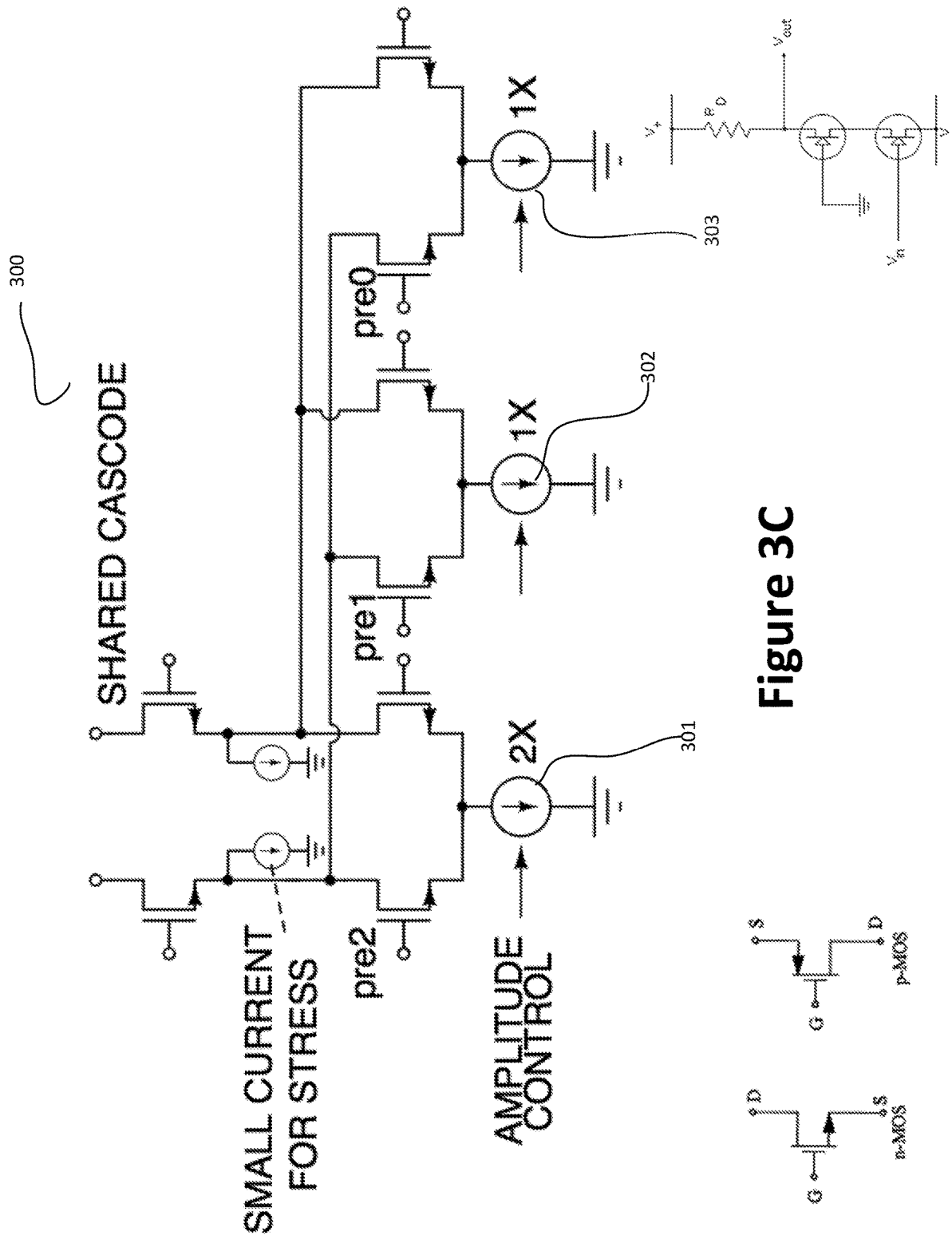
FIG. 3C is a simplified diagram illustrating a mini DAC for pre-distortion compensation according to embodiments of the present invention.

FIG. 3C is a simplified diagram illustrating a mini DAC for pre-distortion compensation according to embodiments of the present invention. This diagram is merely an example, which should not unduly limit the scope of the claims. One of ordinary skill in the art would recognize many variations, alternatives, and modifications. For example, mini DAC 300 in FIG. 3C provide pre-distortion compensation for the main DAC (e.g., the main DAC illustrated in FIG. 2) and is a part of the EML system illustrated in FIG. 1. Mini DAC 300 is coupled to the power supply (e.g., TX supply in FIG. 1) via a cascode section and T-coils. As mentioned above, impedance matching is provided between T-coils and the power supply. For example, T-coils and power supply are coupled via on-chip terminations. The source terminals (or their equivalent in BJT configurations) of the cascode transistors are coupled to small current source to reduce stress. The three bits of the mini DAC 300 are respectively coupled to current sources with amplitude control. For example, bits "pre0" and "pe1" are respectively coupled to current sources 303 and 302 as shown, which provide a "1X" amplitude. Bit "Pre2" is coupled to current source 301, which provides a "2X" amplitude. The input terminals of the pre-distortion bits in mini DAC 300 are coupled to the main DAC.

Depending on the implementation, behavior of mini DAC 300 can be configured in various ways. In a specific embodiment, if BIT5 (the first thermometer bit) of the main DAC is low, bits BIT4, BIT3, and BIT2 are used to toggle mini DAC 300 to add more negative current to compensate. On the other hand, if BIT7 (the last thermometer bit) is high, bits BIT4, BIT3, and BIT2 are used to toggle mini DAC 300 to add more positive current. And while operating between the two sections (e.g., the substantially linear region where pre-distortion compensation is unnecessary), the system shuts off pre-distortion compensation by turning on both differential pairs. For example, keeping both ON speeds up the pre-distortion processing, as turning them both OFF takes longer to recover. In various operation modes, the overhead is slightly more than 1 LSB capacitive load and can be shut off, which gives about 5 dB SNDR boost, or 10 dB Spurious-free dynamic range (SFDR) boost over PVT. In various embodiments, mini DAC 300 is implemented using 28 GHz CMOS custom high-speed logic and long routing. Depending on the implementation, the timing of mini DAC 300 can be non-critical, which allows for 1 or 2 picoseconds of delay.

It is to be appreciated that in addition using mini DACs to provide pre-distortion processing, various EML system according to the presentation also use pre-drivers to improve performance. FIG. 4 is a simplified block diagram illustrating pre-drivers according to embodiments of the present invention. This diagram is merely an example, which should not unduly limit the scope of the claims. One of ordinary skill in the art would recognize many variations, alternatives, and modifications. Among other features, pre-distortion bits are generated at the pre-driver level to save power dissipation. In various embodiments, pre-distortion bits do not need to be serialized from the DSP; they can be generated from the pre-drivers, which save power dissipation. It is to be appreciated that the pre-distortion processing, as used in embodiments of the present invention, can reduce power dissipation, as it allows the drivers to achieve the same SNDR with lower power compared to conventional systems. As shown in FIG. 4, there are number of input buffers and delay gates for each input bit. In operation, timing is matched through gate delays. The delay gates of the pre-drivers are configured in pairs. For example, MSB signals are received as MSBbin and MSBin_bar, and LSB signals are received as LSBin and LSBin_ Bar. Depending on the bit position, different buffer and gate delay arrangement may be used.

Figure 5:
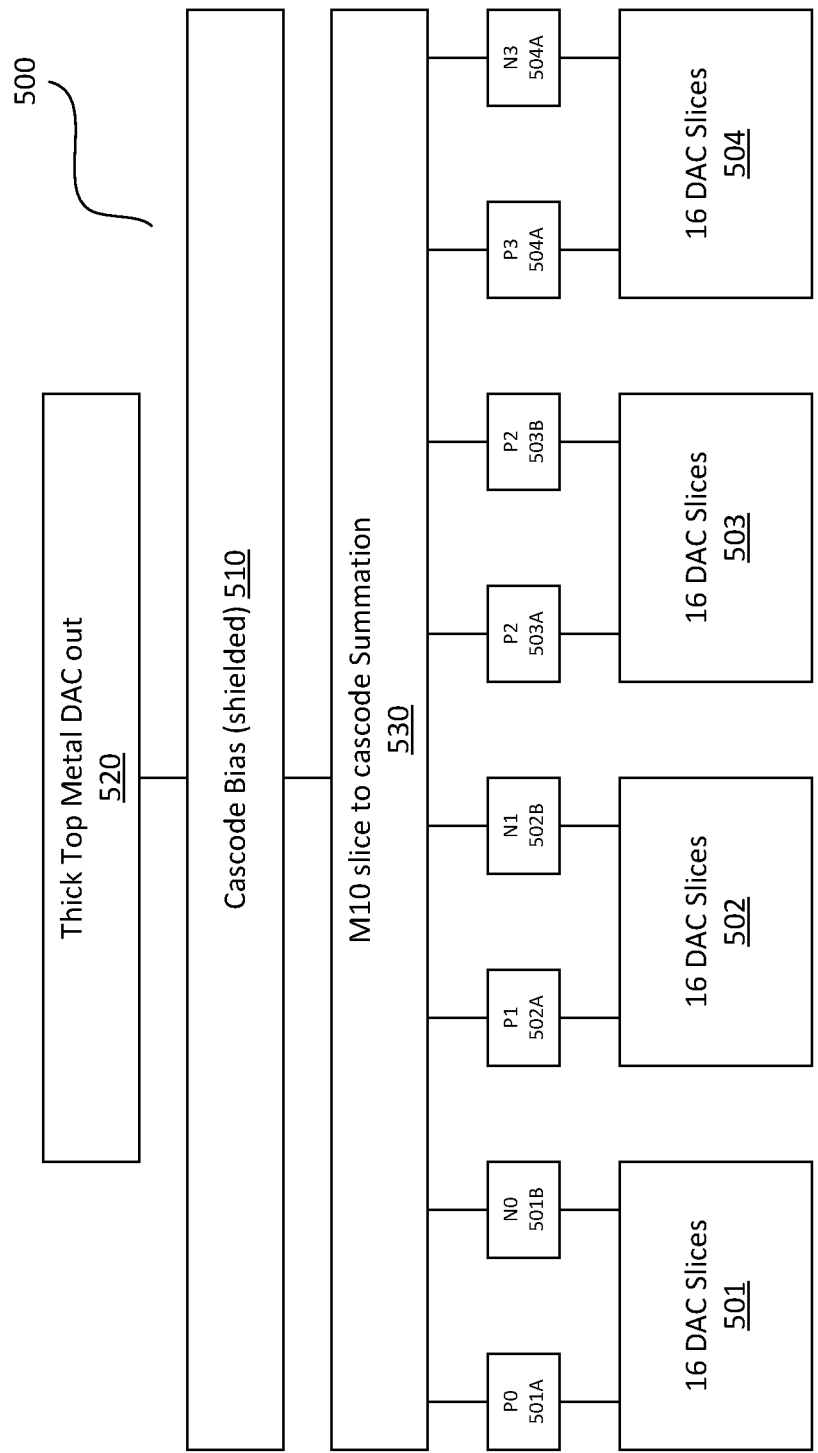
FIG. 5 is a simplified diagram illustrating MSB 16X DAC slice configuration 500 according to embodiment of the present invention

As mentioned above, DAC can be configured as slices. FIG. 5 is a simplified diagram illustrating MSB 16X DAC slice configuration 500 according to embodiment of the present invention. This diagram is merely an example, which should not unduly limit the scope of the claims. One of ordinary skill in the art would recognize many variations, alternatives, and modifications. For example, each MSB pre-driver drives a 16X DAC slice. DAC slices receives digital pre-driver data (e.g., from the pre-driver illustrate in FIG. 4). The DAC slices are coupled to differential input pairs through the pre-driver array. The outputs of DAC slices are in differential pairs. For example, DAC slice 501 is coupled to differential outputs 501A and 501B. Similarly, DAC slice 502 is coupled to differential outputs 502A and 502B, and so on. Cascode section 530 performs signal summation based on the differential outputs. It is to be appreciated that operation of the cascode section is made possible by shielded cascode bias 510. The DAC output, which is a summation of DAC slices, is provided at the DAC output section 520.

Figure 6:
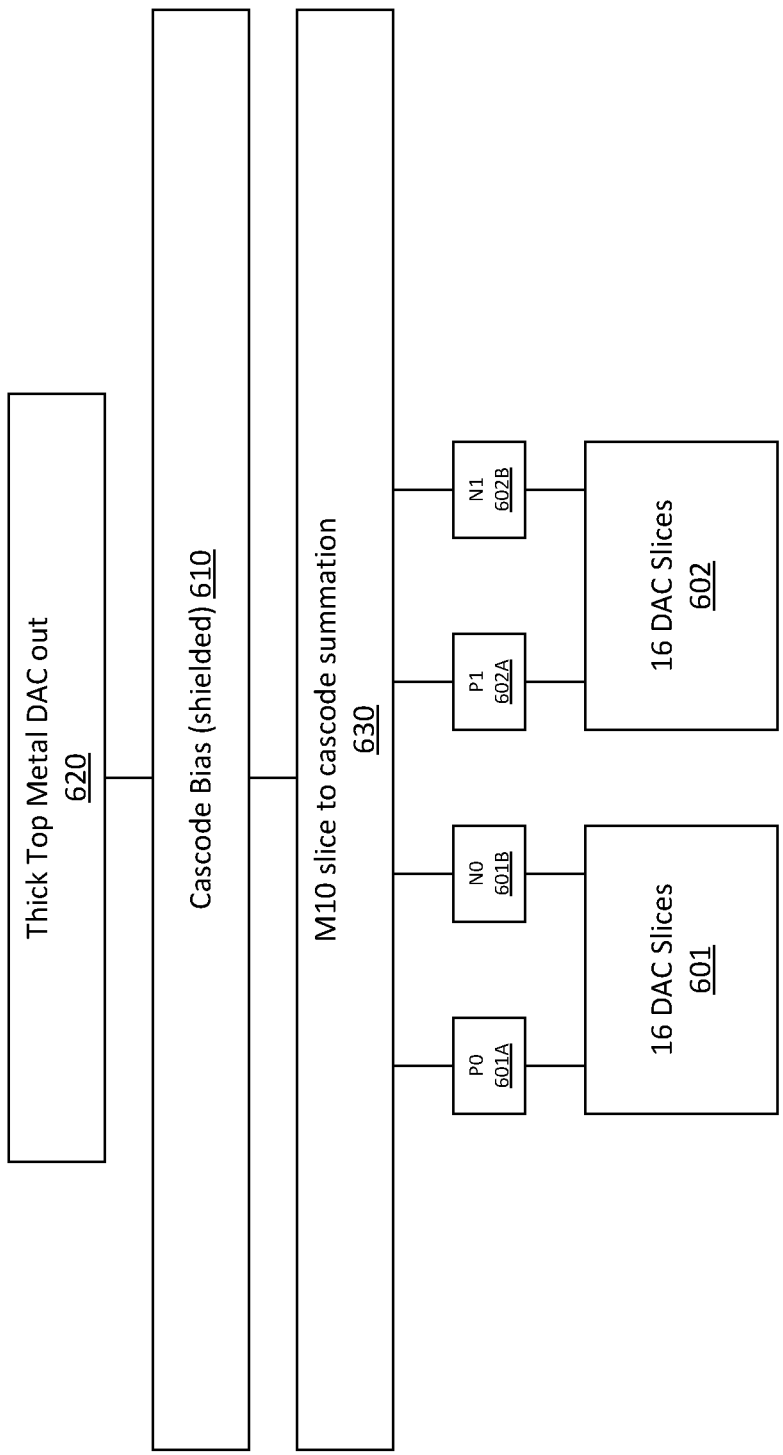
FIG. 6 is a simplified diagram illustrating DAC configuration for an MSB according to embodiments of the present invention.

Depending on the specific bit, configuration of DAC slices may vary. For example, each MSB pre-driver can be configured to drive a single 16X DAC slice. Additionally, each of the MSB bits has a per-slice cascode amplifier. The arrangement for LSBs can be different. For example, LSBs (BIT0, BIT1, BIT2, and BIT3) may share cascode amplifiers to reduce extensive routing, and the impact on SNDR is typically small. In certain implementations, bits implemented with an 8X slice and has an 8X dummy slice to match pre-driver timing. To save power, BIT0, BIT1, and BIT2 may use "smaller" pre-drivers. FIG. 6 is a simplified diagram illustrating DAC configuration for an MSB according to embodiments of the present invention. This diagram is merely an example, which should not unduly limit the scope of the claims. One of ordinary skill in the art would recognize many variations, alternatives, and modifications. For example, the configuration illustrated in FIG. 6 for MSB 32 slices (e.g., for BIT3 of the main DAC). Two sets of 16 DAC slices 601 and 602 respectively provides the differential output pairs P0/N0 and P1/N1. Cascode section 630 sums up differential outputs of the DAC slices. Cascode bias 610 provides bias current to the transistor gates terminals of cascode section 630. The DAC output section 620 provides the output terminals for the DAC output.

As mentioned above, not all bits use multiple slices. While the thermometer-based bits (BIT5, BIT6, and BIT7 at the main DAC section) and BIT4 and BIT 3 of the main DAC are broken up to into 2 slices, the rest of the bits (i.e., LSB bits) comprises single slice and even fractional slices. For example, BIT1 may be implemented with half slice and a half dummy slice driven by 12X inverter, and BIT0 may be implemented with a quarter slice and a three-quarter dummy slice driven by a 12X inverter. It is to be appreciated the main DAC can be implemented in other ways as well.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An integrated communication circuit comprising:
   a digital signal processing module;
   a laser driver module configured to generate a driving signal based at least on an output of the digital signal processing module, the laser driver module comprising:
   a first DAC section configured to convert n bits input signals to a first intermediate signal, the first DAC section comprising one or more thermal bits;
   a distortion compensation section configured to generate a compensation signal based at least on the one or more thermal bits;

a cascode section comprising one or more cascode amplifiers, the cascode section configured to generate a second intermediate signal based on the first intermediate signal and the compensation signal; and a pair of differential output terminals coupled to the cascode section, the differential output terminals configured to provide output signals based at least on the second intermediate signal.

2. The circuit of claim 1 wherein the distortion compensation section comprises a second DAC.

3. The circuit of claim 2 wherein the second DAC section comprises a 3-bit DAC.

4. The circuit of claim 1 wherein the cascode amplifiers are coupled to one or more cascode bias signals.

5. The circuit of claim 1 wherein n equals to 8.

6. The circuit of claim 1 wherein the laser driver module further comprises electrical static discharge modules coupled to the T-coil elements.

7. The circuit of claim 1 wherein the laser driver module further comprises one or more current sources to provide amplitude control based on bit positions of the first DAC section.

8. The circuit of claim 1 further wherein the laser driver module further comprises a look up table, wherein the first DAC section is configured to generate a control signal based on the look up table for the distortion compensation section.

9. The circuit of claim 1 wherein laser driver module further comprises a voltage supply that supports a 2-volt differential voltage swing.

10. The system of claim 1 wherein the laser driver module is configured to perform PAM modulation.

11. The system of claim 1 wherein the laser driver system is configured on a CMOS die.

12. An external modulated laser driver apparatus comprising:

a main DAC section configured to convert n bits input signals to a first intermediate signal, the main DAC section comprising one or more thermal bits;

a mini DAC section configured to generate a compensation signal, the mini DAC section comprises a non-binary DAC;

a cascode section comprising one or more cascode amplifiers, the cascode section being configured to generate a second intermediate signal based on the first intermediate signal and the compensation signal; and a pair of differential output terminals coupled to the cascode section, the differential output terminals being configured to provide output signals based at least on the second intermediate signal.

13. The apparatus of claim 12 wherein the mini DAC comprises m pre-distortion bits.

14. The apparatus of claim 13 wherein m equals to 3.

15. The apparatus of claim 12 further comprising a pre-driver array configured to provide the input signals to the main DAC section.

16. The apparatus of claim 15 wherein the pre-driver array comprises a plurality of gate delays.

17. An external modulated laser driver apparatus comprising:

a supply voltage characterized by a voltage swing of at least 1.9V peak to peak;

a pre-driver array to provide n bits input signals;

a main DAC section configured to convert the n bits input signals to a first intermediate signal, the main DAC section comprising one or more thermal bits;

a mini DAC section comprising m bits and configured to generate a compensation signal based at least on the one or more thermal bits;

a cascode section comprising one or more cascode amplifiers, the cascode section configured to generate a second intermediate signal based on the first intermediate signal and the compensation signal; and a pair of differential output terminals coupled to the cascode section, the differential output terminals being configured to provide output signals based at least on the second intermediate signal.

18. The apparatus of claim 17 wherein the one or more cascode amplifiers are lumped together.

19. The apparatus of claim 17 where at least one of the thermal bits comprises a plurality of DAC slices.

* * * * *